(12) United States Patent
Ma et al.

(10) Patent No.: US 11,746,257 B2
(45) Date of Patent: Sep. 5, 2023

(54) CHEMICAL MECHANICAL POLISHING SOLUTION

(71) Applicant: Anji Microelectronics (Shanghai) Co., Ltd., Shangai (CN)

(72) Inventors: Jian Ma, Shanghai (CN); Jianfen Jing, Shanghai (CN); Junya Yang, Shanghai (CN); Kai Song, Shanghai (CN); Xinyuan Cai, Shanghai (CN); Guohao Wang, Shanghai (CN); Ying Yao, Shanghai (CN); Pengcheng Bian, Shanghai (CN)

(73) Assignee: Anji Microelectronics (Shanghai) Co., Ltd., Shanghai (CN)

( * ) Notice: Subject to any disclaimer, the term of this patent is extended or adjusted under 35 U.S.C. 154(b) by 39 days.

(21) Appl. No.: 16/958,391

(22) PCT Filed: Dec. 26, 2018

(86) PCT No.: PCT/CN2018/124049
§ 371 (c)(1),
(2) Date: Dec. 1, 2020

(87) PCT Pub. No.: WO2019/129103
PCT Pub. Date: Jul. 4, 2019

(65) Prior Publication Data
US 2021/0139740 A1    May 13, 2021

(30) Foreign Application Priority Data
Dec. 27, 2017 (CN) .......................... 201711439569.8

(51) Int. Cl.
*C09G 1/02* (2006.01)
*H01L 21/306* (2006.01)
*H01L 21/321* (2006.01)

(52) U.S. Cl.
CPC .......... *C09G 1/02* (2013.01); *H01L 21/30625* (2013.01); *H01L 21/3212* (2013.01)

(58) Field of Classification Search
CPC . C09G 1/02; H01L 21/30625; H01L 21/3212; H01L 21/304; C23F 3/04
See application file for complete search history.

(56) References Cited

U.S. PATENT DOCUMENTS

| 8,088,690 | B2 | 1/2012 | Mcdevitt et al. | |
|---|---|---|---|---|
| 9,765,239 | B2 | 9/2017 | Yongqing et al. | |
| 2005/0026444 | A1* | 2/2005 | Babu | C09G 1/02 438/697 |
| 2007/0082456 | A1* | 4/2007 | Uotani | C09G 1/02 257/E21.304 |
| 2013/0029489 | A1* | 1/2013 | Suzuki | C09G 1/02 438/693 |
| 2016/0177155 | A1* | 6/2016 | Nakamura | C09G 1/02 252/79.1 |
| 2017/0166778 | A1* | 6/2017 | Lauter | H01L 21/31053 |
| 2017/0304990 | A1* | 10/2017 | Chang | B24B 37/005 |
| 2017/0321168 | A1* | 11/2017 | Hirano | B01D 39/00 |
| 2018/0273764 | A1* | 9/2018 | Sasaki | C01B 33/149 |

FOREIGN PATENT DOCUMENTS

| CN | 101671527 | | 3/2010 | |
|---|---|---|---|---|
| CN | 102093817 | | 6/2011 | |
| CN | 102093817 | A * | 6/2011 | ......... C09K 3/1463 |
| CN | 102341896 | | 2/2012 | |
| CN | 102477260 | A * | 5/2012 | |
| CN | 104745090 | | 7/2015 | |
| CN | 105209563 | | 12/2015 | |
| CN | 105297024 | | 2/2016 | |
| CN | 105803461 | A | 7/2016 | |

OTHER PUBLICATIONS

Clayton, Katherine N. et al., Physical characterization of nanoparticle size and surface modification using particle scattering diffusometry Biofluidics, published online Sep. 21, 2016, AIP Publishing, vol. 10, pp. 054107-1 through 054107-14. (Year: 2016).*

Office Action dated Mar. 31, 2021 in corresponding Chinese Application No. 201711439569.8, 4 pages.

International Search Report and Written Opinion dated Mar. 7, 2019 in corresponding International Patent Application No. PCT/CN2018/124049, filed Dec. 26, 2018, 9 pages.

* cited by examiner

*Primary Examiner* — Shamim Ahmed
(74) *Attorney, Agent, or Firm* — Dentons US LLP

(57) ABSTRACT

The present invention discloses a chemical mechanical polishing slurry, the chemical mechanical polishing slurry comprises silica abrasive particles, a corrosion inhibitor, a complexing agent, an oxidizer, and at least one kind of polyacrylic acid anionic surfactant. The polishing slurry of the present invention can decrease the removal rate of tantalum while increasing the removal rate of copper, and reduce copper dishing and dielectric erosion after polish.

16 Claims, 2 Drawing Sheets

CHEMICAL MECHANICAL POLISHING SOLUTION

CROSS-REFERENCE TO PRIOR APPLICATIONS

This application is a National Stage of PCT/CN2018/124049, filed Dec. 26, 2018, and designating the United States (published on Jul. 4, 2019, as WO 2019/129103 A1), which claims priority under 35 U.S.C. § 119 to Chinese Patent Application No. 201711439569.8, filed Dec. 27, 2017, each hereby expressly incorporated by reference in its entirety and each assigned to the assignee hereof.

TECHNICAL FIELD

The present invention relates to chemical mechanical polishing slurry field, and more particularly to the metal chemical mechanical polishing slurry.

BACKGROUND OF THE INVENTION

With the development of semiconductor technology and the miniaturization of electronic components, an integrated circuit contains millions of transistors. Based on the traditional aluminum or aluminum alloy interconnections, a large number of transistors which can be switched on and off rapidly are integrated, which not only reduces the signal transmission speed, but also consumes a lot of energy in the process of current transmission, thus which hinders the development of semiconductor technology to some extent.

For this reason, the industry began to look for materials with higher electrical properties to replace aluminum. It is well known that copper has small resistance and good conductivity, which can accelerate the signal transmission speed between transistors in the circuit, and can also provide smaller parasitic capacitance, thereby reducing the sensitivity of the circuit to electro migration. Therefore, the above electrical advantages make copper have a good prospect in the development of semiconductor technology.

However, during the manufacturing process of copper integrated circuits, it is found that copper migrates or diffuses into the transistor regions of integrated circuits, which adversely affects transistor performance in semiconductors. Therefore, copper interconnections can only be manufactured by Damascene process, i.e., forming trenches in the first layer, filling in the trenches with copper barrier layers and copper to form metal wires covering the dielectric layer. Thereafter, the overburdened copper/copper barrier layer on the dielectric layer is removed by chemical mechanical polishing, leaving a single interconnection in the trench.

Copper chemical mechanical polishing process generally consists of three steps. The first step is to remove bulk copper with high removal rate, leaving copper with a certain thickness, the second step is to remove remaining copper with a relative low removal rate and stopping on the barrier layer, and the third step is to remove the barrier layer, partial dielectric layer and copper with the barrier layer polishing slurry, so as to achieve the planarization.

However, before polishing, there is recess in copper surface above the trench. When polishing, the copper above the dielectric materials is easy to be removed under the polishing pressure (relative higher), while the polishing pressure of the copper in the recess area is relatively lower, results in a lower copper removal rate. As the polishing progresses, the step height of copper decreases gradually, resulting in planarization. However, during the polishing process, if the chemical effect of the copper polishing slurry is too strong and the static etch rate is too high, the passivation film on copper surface is easy to be removed even under low pressure (e.g. at the recess area), resulting in lower planarization efficiency and larger dishing after polishing. Therefore, for the chemical mechanical polishing (CMP) of copper, on the one hand, the overburdened copper on the barrier layer needs to be removed as soon as possible, on the other hand, the copper dishing after polishing need to be minimized.

With the development of integrated circuits, on the one hand, In order to improve integration, decrease energy consumption and shorten delay time, the copper width is narrower and narrower, the dielectric layer uses low-k materials with lower mechanical strength, and the number of copper layers is also increasing. In order to ensure the performance and stability of integrated circuits, the requirement for copper chemical mechanical polishing is also becoming more stringent. It is required to improve the planarization of the copper surface and control the surface defects while maintaining Cu removal rate at reduced polishing downforce. On the other hand, due to the physical limitations, the line width cannot be reduced indefinitely. To improve the performance, the semiconductor industry no longer relies solely on the integration of more devices on a single chip, but turns to multi-chip packaging.

With the development of semiconductor manufacturing process, in order to improve the application of copper in semiconductor technology, a metal chemical mechanical polishing slurry is urgently needed, which can improve the removal rate of copper and the removal rate selectivity of copper to tantalum barrier layers, and reduce the copper dishing without copper residue, corrosion or other defects after polishing.

SUMMARY OF THE INVENTION

In order to solve the above problems, the present invention provides a chemical mechanical polishing slurry, by adding silica abrasive particles with wide size distribution, azole corrosion inhibitor without benzene and polyacrylic acid anionic surfactants into the polishing slurry, it can improve removal rate selectivity of copper to tantalum barrier layers, and reduce Cu dishing and dielectric erosion, without copper residue, corrosion or other defects after polishing.

The present invention provides chemical mechanical polishing slurry, wherein the chemical mechanical polishing slurry comprises silica abrasive particles, a corrosion inhibitor, a complexing agent, an oxidizer, and at least one kind of polyacrylic acid anionic surfactant.

Preferably, the average particle size of the abrasive particle is 60-140 nm, more preferably is 80-120 nm.

Preferably, the particle size distribution index (PdI) of the abrasive particle is 0.1~0.6.

Preferably, the concentration of the abrasive particle is 0.05~2 wt %, more preferably is 0.1~1 wt %.

Preferably, the polyacrylic acid anionic surfactant is polyacrylic acid homopolymers and/or polyacrylic acid copolymers and the salt of polyacrylic acid homopolymers and/or polyacrylic acid copolymers.

Preferably, the polyacrylic acid homopolymer is polyacrylic acid and/or polymaleic acid; the polyacrylic acid copolymer is polyacrylic acid—polyacrylate copolymer and/or polyacrylic acid—polymaleic acid copolymer; and the salt of the polyacrylic acid homopolymer and/or polyacrylic acid copolymer are potassium salt, ammonium salt and/or sodium salt.

Preferably, the molecular weight of the polyacrylic acid anionic surfactant is 1,000~10,000, more preferably is 2,000~5,000.

Preferably, the concentration of the polyacrylic acid anionic surfactant is 0.0005~0.5 wt %, more preferably is 0.001~0.1 wt %.

Preferably, the complexing agent is an ammonia carboxyl compound and its salt.

Preferably, the complexing agent is selected from one or more of glycine, alanine, valine, leucine, proline, phenylalanine, tyrosine, tryptophan, lysine, arginine, histidine, serine, aspartic acid, glutamic acid, asparagine, glutamine, aminotriacetic acid, ethylenediamine tetraacetic acid, cyclohexanediamine tetraacetic acid, ethylenediamine disuccinic acid, diethylenetriamine pentaacetic acid and triethylene tetramine hexaacetic acid.

Preferably, the content of the complexing agent is 0.1~5 wt %, more preferably is 0.5~3 wt %.

Preferably, the corrosion inhibitor is one or more of azoles compounds without benzene.

Preferably, the corrosion inhibitor is selected from one or more of 1,2,4-triazole, 3-amino-1,2,4-triazole, 4-amino-1,2,4-triazole, 3,5-diamino-1,2,4-triazole, 5-carboxy-3-amino-1,2,4-triazole, 3-amino-5-mercapto-1,2,4-triazole, 5-acetic acid-1H-tetrazole, 5-methyltetrazole and 5-amino-1H-tetrazole.

Preferably, the content of the corrosion inhibitor is 0.001~2 wt %, more preferably is 0.005~1 wt %.

Preferably, the oxidizer is selected from one or more of hydrogen peroxide, urea peroxide, peroxyformic acid, peracetic acid, persulfate, percarbonate, periodic acid, perchloric acid, perboric acid e, potassium permanganate, and iron nitrate.

Preferably, the oxidizer is hydrogen peroxide.

Preferably, the concentration of the oxidizer is 0.05~5 wt %, more preferably is 0.1~3 wt %.

Preferably, the pH of the chemical mechanical polishing slurry is 6~9.

The polishing slurry of the present invention may also comprise other commonly used additives such as a pH adjustor, a viscosity adjustor, a defoaming agent and so on to achieve the polishing performance.

The polishing slurry of the present invention can be concentrated. It can be diluted with deionized water r to the concentration range of the present invention and add oxidize before using.

Compared with the prior art, the technical advantages of the present invention are as follows:

1. The removal rate of tantalum is decreased while the removal rate of copper is increased;
2. It can reduce copper dishing and dielectric erosion after polish.

DETAILED DESCRIPTION OF THE INVENTION

Figure 1:
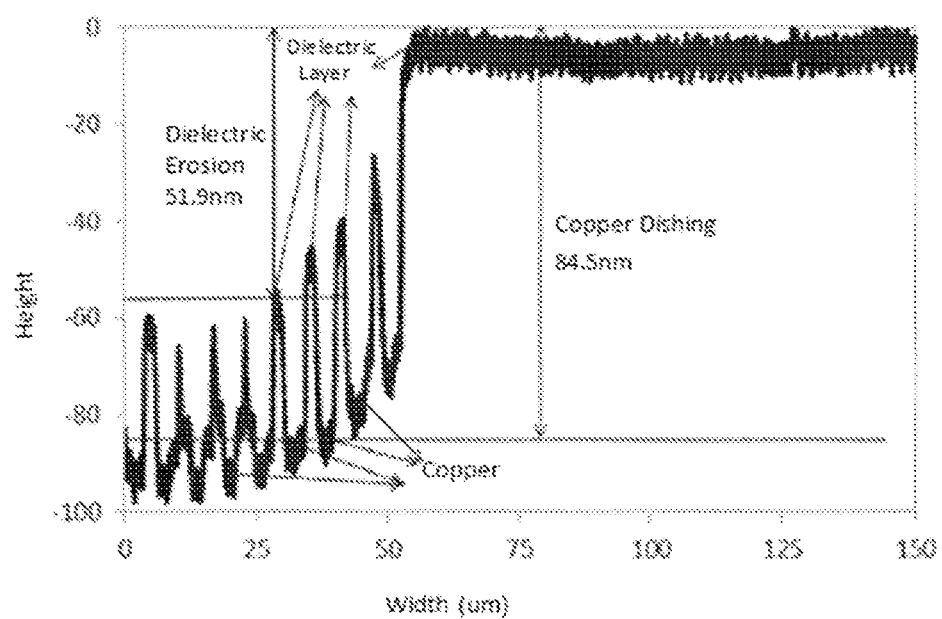
FIG. 1 shows the surface topography of the dense array area in the copper patterned wafer after polishing by the contrastive embodiment 5.

The present invention is further described in the way of embodiments, but the present invention is not limited to the scope of the embodiments.

Table 1 shows embodiments 1-4 of the chemical mechanical polishing slurry of the present invention. According to the formula given in the table, the components except the oxidizer are mixed homogeneously and the water makes up the quality percentage to 100%, KOH or $HNO_3$ was added to adjust pH to the desired value. The oxidizer was added before using and then mixing homogeneously.

TABLE 1 the polishing slurry of the embodiments 1~24 of the present invention

| polishing slurry | abrasive particle | | | corrosion inhibitor | | polyacrylic anionic surfactant | | complexing agent | | oxidizing agent | | pH |
| --- | --- | --- | --- | --- | --- | --- | --- | --- | --- | --- | --- | --- |
| | content (%) | partical size | particle size distribution | content (%) | specific substance | content (%) | specific substance | content (%) | specific substance | content (%) | specific substance | |
| Embodiment 1 | 0.5 | 110 nm | 0.16 | 0.15 | 1,2,4-triazole | 0.002 | polyacrylic acid Mw = 3000 | 1 | glycine | 1 | hydrogen peroxide | 7 |
| Embodiment 2 | 0.05 | 90 nm | 0.3 | 0.08 | 3-amino-1,2,4-triazole | 0.001 | polymaleic acid Mw = 2000 | 2 | ethylenediamine disuccinic acid | 2.5 | ammonium persulfate | 5 |
| Embodiment 3 | 0.1 | 90 nm | 0.20 | 0.5 | 5-diamino-1,2,4-triazole | 0.01 | polyacrylic acid Mw = 1000 | 0.5 | cyclohexanediamine tetraacetic acid | 3.5 | hydrogen peroxide | 6 |
| Embodiment 4 | 0.2 | 80 nm | 0.1 | 1 | 3,5-diamino-1,2,4-triazole | 0.01 | polymethyl methacrylate Mw = 5000 | 2.5 | ethylenediamine tetraacetic acid | 4.5 | urea peroxide | 6 |
| Embodiment 5 | 0.3 | 100 nm | 0.12 | 2 | 5-methyltetrazole and 5-amino-1H-tetrazole | 0.003 | ammonium polyacrylate Mw = 3000 | 3 | triethylenetetramine hexaacetic acid | 0.1 | hydrogen peroxide | 5 |
| Embodiment 6 | 0.5 | 90 nm | 0.18 | 0.001 | 5-amino-1,2,4-triazole | 0.01 | polyacrylic acid Mw = 10000 | 1 | leucine | 3 | peracetic acid | 7 |

TABLE 1-continued the polishing slurry of the embodiments 1~24 of the present invention

| polishing slurry | abrasive particle | | | corrosion inhibitor | | polyacrylic anionic surfactant | | complexing agent | | oxidizing agent | | pH |
|---|---|---|---|---|---|---|---|---|---|---|---|---|
| | content (%) | partical size | particle size distribution | content (%) | specific substance | content (%) | specific substance | content (%) | specific substance | content (%) | specific substance | |
| Embodiment 7 | 2 | 70 nm | 0.6 | 0.06 | 5-acetic acid-1H-tetrazole | 0.02 | ammonium polyacrylate Mw = 3000 | 0.5 | alanine | 0.05 | hydrogen peroxide | 7 |
| Embodiment 8 | 1.5 | 70 nm | 0.26 | 0.5 | 5-carboxy-3-amino-1,2,4-triazole | 0.01 | potassium polyacrylate Mw = 3000 | 5 | threonine | 1 | Potassium persulfate | 5 |
| Embodiment 9 | 2 | 60 nm | 0.6 | 0.8 | 4-amino-1,2,4-triazole | 0.01 | polyacrylic acid Mw = 3000 | 1 | valine | 1 | ammonium persulfate | 5 |
| Embodiment 10 | 0.5 | 60 nm | 0.2 | 0.01 | 3,5-diamino-1,2,4-triazole | 0.005 | polymaleic acid Mw = 3000 | 2 | aminotriacetic acid | 5 | Ferric nitrate | 5 |
| Embodiment 11 | 0.1 | 120 nm | 0.1 | 0.5 | 3-amino-1,2,4-triazole | 0.001 | acrylic acid-acrylamide copolymer Mw = 8000 | 0.15 | phenylalanine | 3 | hydrogen peroxide | 5 |
| Embodiment 12 | 0.15 | 120 nm | 0.15 | 0.15 | 5-amino-1H-tetrazole | 0.01 | acrylic acid-acrylic ester copolymer Mw = 4000 | 1.8 | asparagine | 2 | hydrogen peroxide | 6 |
| Embodiment 13 | 0.25 | 80 nm | 0.22 | 0.005 | 4-amino-1,2,4-triazole | 0.02 | polyacrylic acid Mw = 3000 | 1.5 | serine | 2 | perchloric acid | 6 |
| Embodiment 14 | 0.8 | 60 nm | 0.25 | 1 | 5-methyltetrazole | 0.02 | acrylic acid-maleic anhydride copolymer Mw = 6000 | 1 | proline | 3 | hydrogen peroxide | 6 |
| Embodiment 15 | 1 | 80 nm | 0.13 | 0.02 | 5-amino-1H-tetrazole | 0.5 | ammonium polyacrylate salt Mw = 3000 | 3 | tryptophan | 1 | hydrogen peroxide | 6 |
| Embodiment 16 | 2 | 80 nm | 0.16 | 0.5 | 3,5-diamino-1,2,4-triazole | 0.3 | polyacrylic acid Mw = 1000 | 1.2 | valine | 1 | hydrogen peroxide | 6 |
| Embodiment 17 | 0.5 | 140 nm | 0.1 | 0.1 | 4-amino-1,2,4-triazole | 0.001 | Acrylic acid-methyl methacrylate copolymer Mw = 4000 | 0.8 | aspartic acid | 2 | hydrogen peroxide | 7 |
| Embodiment 18 | 0.3 | 80 nm | 0.24 | 0.6 | 3,5-diamino-1,2,4-triazole | 0.002 | Acrylic acid-methyl methacrylate copolymer Mw = 2000 | 3 | glutamic acid | 2 | periodic acid | 7 |
| Embodiment 19 | 1 | 140 nm | 0.11 | 0.8 | 5-acetic acid-1H-tetrazole | 0.003 | poly ethyl acrylate Mw = 5000 | 1 | arginine | 1 | perboric acid | 6 |
| Embodiment 20 | 0.5 | 80 nm | 0.22 | 0.05 | 4-amino-1,2,4-triazole | 0.005 | polyacrylic acid Mw = 3500 | 1.5 | lysine | 1 | hydrogen peroxide | 7 |
| Embodiment 21 | 1 | 80 nm | 0.24 | 0.3 | 3-amino-5-mercapto-1,2,4-triazole | 0.1 | polyacrylic acid Mw = 7000 | 1.5 | histidine | 3 | hydrogen peroxide | 7.5 |
| Embodiment 22 | 0.2 | 70 nm | 0.23 | 0.09 | 3-amino-5-mercapto-1,2,4-triazole | 0.2 | polyacrylic acid Mw = 5000 | 2 | tyrosine | 3 | potassium permanganate | 7 |
| Embodiment 23 | 0.5 | 100 nm | 0.16 | 0.005 | 5-carboxy-3-amino-1,2,4-triazole | 0.0005 | Acrylic acid-methyl methacrylate copolymer Mw = 6000 | 0.1 | glutamine | 2 | peroxyformic acid | 8 |
| Embodiment 24 | 0.5 | 120 nm | 0.1 | 0.05 | 3-amino-1,2,4-triazole | 0.5 | Acrylic acid-methyl methacrylate copolymer Mw = 2300 | 0.2 | diethylenetriamine pentaacetic acid | 2 | Sodium percarbonate | 8 |

Effect Embodiments

Table 2 shows the embodiments 25~35 and the contrastive embodiments 1~6 of the chemical mechanical polishing slurry of the present invention. According to the formula given in the table, the components except the oxidizer are mixed homogeneously and the water makes up the quality percentage to 100%. KOH or $HNO_3$ was added to adjust pH to the desired value. The oxidizing agent was added before using and then mixing homogeneously

TABLE 2 contrastive embodiments 1~6 and embodiments 25~35

| polishing slurry | abrasive particle content (%) | partical size | particle size distribution | corrosion inhibitor content (%) | specific substance | polyacrylic anionic surfactant specific material content (%) | (monoester/diester) | complexing agent content (%) | specific substance | oxidizing agent content (%) | specific substance | pH |
|---|---|---|---|---|---|---|---|---|---|---|---|---|
| contrastive embodiment 1 | 0.2 | 40 | 0.7 | 0.1 | 1,2,4-triazole | 0.01 | polyacrylic acid Mw = 3000 | 1 | glycine | 1 | hydrogen peroxide | 7 |
| contrastive embodiment 2 | 0.2 | 150 | 0.05 | 0.05 | 1,2,4-triazole | 0.01 | polyacrylic acid Mw = 3000 | 1 | glycine | 1 | hydrogen peroxide | 7 |
| contrastive embodiment 3 | 0.2 | 110 | 0.12 | 0.05 | 1,2,4-triazole | 0.01 | polyacrylic acid Mw = 3000 | 1 | glycine | 1 | hydrogen peroxide | 4 |
| contrastive embodiment 4 | 0.2 | 110 | 0.12 | 0.05 | 1,2,4-triazole | 0.01 | polyacrylic acid Mw = 3000 | 1 | glycine | 1 | hydrogen peroxide | 9 |
| contrastive embodiment 5 | 0.2 | 110 | 0.12 | 0.05 | 1,2,4-triazole | — | — | 1 | glycine | 1 | hydrogen peroxide | 7 |
| contrastive embodiment 6 | 0.2 | 110 | 0.12 | 0.05 | benzotriazole | 0.01 | polyacrylic acid Mw = 3000 | 1 | glycine | 1 | hydrogen peroxide | 7 |
| embodiment 25 | 0.2 | 110 | 0.12 | 0.05 | 1,2,4-triazole | 0.01 | polyacrylic acid Mw = 3000 | 1 | glycine | 1 | hydrogen peroxide | 7 |
| embodiment 26 | 0.2 | 80 | 0.6 | 0.05 | 1,2,4-triazole | 0.01 | ammonium polyacrylate Mw = 3000 | 1 | glycine | 1 | hydrogen peroxide | 7 |
| embodiment 27 | 0.3 | 90 | 0.5 | 0.02 | 5-acetic acid-1H-tetrazole | 0.005 | polyacrylic acid Mw = 2000 | 1 | glycine | 1.5 | hydrogen peroxide | 6 |
| embodiment 28 | 0.8 | 120 | 0.1 | 0.05 | 3-amino-1,2,4-triazole | 0.005 | acrylic acid-maleic anhydride copolymer Mw = 3000 | 2.5 | glycine | 2 | hydrogen peroxide | 5 |
| embodiment 29 | 0.7 | 90 | 0.13 | 0.15 | 1,2,4-triazole | 0.01 | ammonium polyacrylate Mw = 2000 | 1 | glycine | 1 | hydrogen peroxide | 7 |
| embodiment 30 | 0.6 | 90 | 0.3 | 1 | 4-amino-1,2,4-triazole | 0.06 | polyacrylic acid Mw = 5000 | 3 | glycine | 1.2 | hydrogen peroxide | 7.5 |
| embodiment 31 | 0.15 | 80 | 0.6 | 0.5 | 1,2,4-triazole | 0.05 | acrylic acid-acrylic ester copolymer Mw = 5000 | 1.5 | glycine | 1 | hydrogen peroxide | 8 |
| embodiment 32 | 0.1 | 110 | 0.21 | 0.08 | 1,2,4-triazole | 0.02 | potassium polyacrylate Mw = 3000 | 0.5 | ethylenediamine disuccinic acid | 0.5 | hydrogen peroxide | 6 |
| embodiment 33 | 1 | 90 | 0.5 | 0.05 | 4-amino-1,2,4-triazole | 0.1 | polyacrylic acid Mw = 4000 | 3 | proline | 3 | hydrogen peroxide | 8 |
| embodiment 34 | 0.3 | 80 | 0.4 | 0.8 | 1,2,4-triazole | 0.003 | potassium polyacrylate Mw = 3000 | 2 | glycine | 2.5 | hydrogen peroxide | 8 |
| embodiment 35 | 0.5 | 120 | 0.11 | 0.005 | 5-amino-1H-tetrazole | 0.001 | ammonium polyacrylate Mw = 3500 | 1.2 | glycine | 0.1 | hydrogen peroxide | 6.5 |

The copper (Cu) and tantalum (Ta) of the blanket wafers are polished by the polishing slurry of contrastive embodiments 1~6 and embodiments 25~35 of the present invention according to the following conditions.

Polishing conditions: downforce: 1.5 psi, 2.0 psi; polishing platen/polishing head rotation speed: 73/67 rpm, polishing pad: IC1010, the flow rate of polishing slurry is 350 ml/min, polisher: 12" Reflexion LK, polishing time: 1 min.

Copper patterned wafers are polished by the polishing slurry of the contrastive embodiments and the present invention according to the following conditions.

Polishing conditions: polishing platen/polishing head rotation speed: 73/67 rpm, polishing pad: IC1010, the flow rate of polishing slurry is 350 ml/min, polisher: 12" Reflexion LK. The copper patterned wafer is polished on the polishing platen 1 with a downforce of 2 psi until that the remaining copper thickness is about 4000 Å, and then the remaining copper is removed on the polishing platen 2 with a downforce of 1.5 psi. The value of Cu dishing and erosion of the dielectric layer of the array of the 5/1 um (copper wire/silica) on the patterned wafer are measured by XE-300P atomic force microscope, as the result is shown in Table 3.

Figure 2:
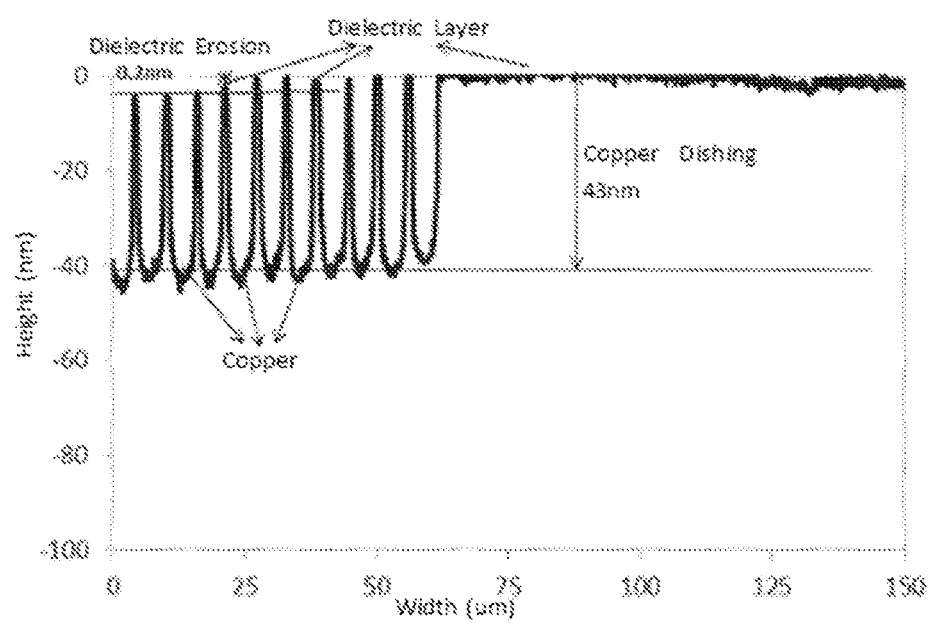
FIG. 2 shows the surface topography of the dense array area in the copper patterned wafer after polishing by the embodiment 25.

Further referring to FIG. 1 and FIG. 2, they are the surface topography of the dense array area with a copper line width of 5 microns and a dielectric material width of 1 micron in the polished copper patterned wafer after using the polishing slurry of the contrastive embodiment 5 and embodiment 25, respectively. It can be seen from the figures that after polishing, Cu dishing is 89.1 nm and dielectric erosion is 59.2 nm when using the polishing slurry of the contrastive embodiment 5. However, the dishing is reduced to 43 nm and the dielectric erosion is reduced to 0.2 nm after polishing with embodiment 25. The polishing slurry of the present invention has a very significant improvement on the surface topography especially erosion after polishing. At the same time, by comparing the composition between the embodiment 25 and the contrastive embodiment 6, it can be found that the combination of benzotriazole, an azole corrosion inhibitor with benzene, and polyacrylic acid anionic surfactant can reduce the removal rate of tantalum, but also significantly suppress the removal rate of copper, so the copper cannot be effectively removed. Compared with embodiment 25 of the present invention, a combination of azole corrosion inhibitor without benzene and polyacrylic acid anionic surfactant is added into the polishing slurry of

TABLE 3 polishing effect of the polishing slurry of the contrastive embodiments 1~6 and the embodiments 25~35

| polishing slurry | removal rate of Cu (Å/min) | | removal rate of Ta (Å/min) | polishing selectivity of Cu/Ta | dishing value of the 5/1 um array (nm) | dielectric erosion value of the 5/1 um array (nm) |
|---|---|---|---|---|---|---|
| | 2.0 psi | 1.5 psi | 1.5 psi | | | |
| contrastive embodiment 1 | 4500 | 2100 | 2 | 1050 | / | / |
| contrastive embodiment 2 | 3910 | 2102 | 2 | 1051 | / | / |
| Contrastive embodiment 3 | 6767 | 4880 | 8 | 610 | 111 | 10.5 |
| contrastive embodiment 4 | 2150 | 1500 | 3 | 500 | / | / |
| contrastive embodiment 5 | 7355 | 5204 | 50 | 104 | 89.1 | 59.2 |
| contrastive embodiment 6 | 1450 | 260 | 5 | 52 | / | / |
| embodiment 25 | 6461 | 4511 | 2 | 2256 | 43 | 0.2 |
| embodiment 26 | 6299 | 4418 | 2 | 2209 | 45 | 0.3 |
| embodiment 27 | 6286 | 4886 | 3 | 1629 | 43.1 | 0.3 |
| embodiment 28 | 10714 | 5326 | 3 | 1775 | / | / |
| embodiment 29 | 6403 | 4332 | 3 | 1444 | 51 | 5 |
| embodiment 30 | 5592 | 2052 | 2 | 1026 | 45 | 0.8 |
| embodiment 31 | 4211 | 1811 | 3 | 604 | / | / |
| embodiment 32 | 4133 | 2242 | 5 | 448 | / | / |
| embodiment 33 | 4109 | 2137 | 2 | 1069 | / | / |
| embodiment 34 | 8622 | 4362 | 3 | 1454 | 56 | 4 |
| embodiment 35 | 4134 | 1724 | 2 | 862 | / | / |

According to table 2 and table 3, it can be seen from the polishing slurry of the contrastive embodiment 1, 2 and the embodiment 25, 26 that when the abrasive particle size is large but the particle size distribution is narrow (PdI is small) or the abrasive particle size is small but the particle size distribution is wide (PdI is large), the removal rate of Cu is relatively lower. The Cu removal rate increases only when the particle size and the particle size distribution of abrasive particles vary within a certain range. The addition of polyacrylic acid anionic surfactant can suppress the removal rate of Ta to a relatively low removal rate, thus achieving a high removal rate selectivity of Cu to Ta, up to 2200. In addition, compared to the contrastive embodiments 1-6, the polishing slurry of the embodiment 25 can further control the dishing and dielectric erosion of the wafer on the basis of having an ultra-high polishing selectivity of Cu to Ta.

the contrastive embodiment 3 and 4, but the pH value of the contrastive embodiment 3 is too low, and the removal rate of copper and tantalum are relatively high, resulting in a large dishing and erosion value. However, the pH value of the contrastive embodiment 4 is too high that the removal rate of copper is greatly decreased, and copper cannot be effectively removed.

In conclusion, the invention not only ensures high removal rate of copper, but also reduces defects of the surface by using abrasive particles within a certain range of PdI. By adding azole corrosion inhibitor without benzene and polyacrylic acid anionic surfactant into the polishing slurry, the high removal rate of copper is maintained, and the removal rate of tantalum barrier layer is reduced, so as to improve the polishing selectivity of the polishing slurry of the copper to tantalum barrier layer. The present invention can be used for polishing the wafers to reduce dishing and erosion, without copper residue, corrosion or other defects after polishing.

The specific embodiment of the present invention has been described in detail above, but it is only an example, and the present invention is not limited to the specific embodiment described above. Any person skilled in the art can make alterations or modifications to the embodiments by the aforementioned technical contents, to form an equivalent and effective embodiment. Any amendments, equivalent changes and modifications to the above-mentioned embodiments based on the technical essence of the present invention, without departing from the technical solutions of the present invention, shall belong to the scope defined by the technical solutions of the present invention.

What is claimed is:

1. A chemical mechanical polishing slurry for polishing copper, characterized in that the chemical mechanical polishing slurry consists of silica abrasive particles, a corrosion inhibitor, a complexing agent, an oxidizer, water and at least one kind of polyacrylic acid anionic surfactant,
    wherein the corrosion inhibitor is one or more azole compounds selected from triazoles and tetrazoles that do not contain a benzene moiety;
    wherein the complexing agent is one or more selected from the group consisting of glycine, alanine, valine, leucine, proline, phenylalanine, tyrosine, tryptophan, lysine, arginine, histidine, serine, aspartic acid, glutamic acid, asparagine and glutamine,
    wherein an average particle size of the silica abrasive particles is 60-140 nm,
    wherein a particle size distribution index (PdI) of the silica abrasive particles is 0.18-0.60, and
    wherein a pH of the chemical mechanical polishing slurry is 6-9.

2. The chemical mechanical polishing slurry according to claim 1, wherein a concentration of the silica abrasive particles is 0.05-2 wt %.

3. The chemical mechanical polishing slurry according to claim 1, wherein the polyacrylic acid anionic surfactant is selected from the group consisting of polyacrylic acid homopolymers, polyacrylic acid copolymers, a salt of polyacrylic acid homopolymers, and a salt of polyacrylic acid copolymers.

4. The chemical mechanical polishing slurry according to claim 3, wherein the polyacrylic acid homopolymer is selected from the group consisting of a polyacrylic acid homopolymer and a polymaleic acid homopolymer.

5. The chemical mechanical polishing slurry according to claim 3, wherein the polyacrylic acid copolymer is selected from the group consisting of a polyacrylic acid—polyacrylate copolymer and a polyacrylic acid—polymaleic acid copolymer.

6. The chemical mechanical polishing slurry according to claim 3, wherein the salt of the polyacrylic acid homopolymer is selected from a sodium salt, a potassium salt and an ammonium salt of the polyacrylic acid homopolymer.

7. The chemical mechanical polishing slurry according to claim 3, wherein the salt of the polyacrylic acid copolymer is selected from a sodium salt, a potassium salt and an ammonium salt of the polyacrylic acid copolymer.

8. The chemical mechanical polishing slurry according to claim 1, wherein a molecular weight of the polyacrylic acid anionic surfactant is 1,000-10,000.

9. The chemical mechanical polishing slurry according to claim 8, wherein the molecular weight of the polyacrylic acid anionic surfactant is 2,000-5,000.

10. The chemical mechanical polishing slurry according to claim 1, wherein a concentration of the polyacrylic acid anionic surfactant is 0.0005-0.5 wt %.

11. The chemical mechanical polishing slurry according to claim 1, wherein the complexing agent is present in an amount of 0.1-5 wt %.

12. The chemical mechanical polishing slurry according to claim 1, wherein the corrosion inhibitor is one or more selected from the group consisting of 1,2,4-triazole, 3-amino-1,2,4-triazole, 4-amino-1,2,4-triazole, 3,5-diamino-1,2,4-triazole, 5-carboxy-3-amino-1,2,4-triazole, 3-amino-5-mercapto-1,2,4-triazole, 5-acetic acid-1H-tetrazole, 5-methyltetrazole and 5-amino-1H-tetrazole.

13. The chemical mechanical polishing slurry according to claim 1, wherein the corrosion inhibitor is present in an amount of 0.001-2 wt %.

14. The chemical mechanical polishing slurry according to claim 1, wherein the oxidizer is one or more selected from the group consisting of hydrogen peroxide, urea peroxide, peroxyformic acid, peracetic acid, persulfate, percarbonate, periodic acid, perchloric acid, perboric acid, potassium permanganate, and iron nitrate.

15. The chemical mechanical polishing slurry according to claim 14, wherein the oxidizer is hydrogen peroxide.

16. The chemical mechanical polishing slurry according to claim 1, wherein a concentration of the oxidizer is 0.05-5 wt %.

* * * * *